United States Patent
Kubokawa et al.

(10) Patent No.: US 7,835,156 B2
(45) Date of Patent: Nov. 16, 2010

(54) POWER DRIVE UNIT

(75) Inventors: Minoru Kubokawa, Takanezawa-machi (JP); Takeshi Nakamura, Takanzawa-machi (JP); Takaaki Iijima, Wako (JP)

(73) Assignees: Keihin Corporation, Tokyo (JP); Honda Motor Co., Ltd., Tokyo (JP)

( * ) Notice: Subject to any disclaimer, the term of this patent is extended or adjusted under 35 U.S.C. 154(b) by 1469 days.

(21) Appl. No.: 11/220,626

(22) Filed: Sep. 8, 2005

(65) Prior Publication Data

US 2006/0052914 A1  Mar. 9, 2006

(30) Foreign Application Priority Data

Sep. 9, 2004 (JP) ............... 2004-262673

(51) Int. Cl.
  H05K 7/02 (2006.01)
  H05K 7/06 (2006.01)
  H05K 7/08 (2006.01)
  H05K 7/10 (2006.01)
(52) U.S. Cl. ............... 361/760; 361/775; 361/790
(58) Field of Classification Search ........... 361/775, 361/790; 257/690–692
  See application file for complete search history.

(56) References Cited

U.S. PATENT DOCUMENTS 4,965,710 A * 10/1990 Pelly et al. ............ 363/56.03
5,519,252 A * 5/1996 Soyano et al. ............ 257/690
5,966,291 A * 10/1999 Baumel et al. ........... 361/707

FOREIGN PATENT DOCUMENTS

| JP | 09-047034 | 2/1997 |
| JP | 11-026955 | 1/1999 |
| JP | 11-233913 A | 8/1999 |
| JP | 2003-124045 A | 4/2003 |
| WO | WO 03/085814 A1 | 10/2003 |

OTHER PUBLICATIONS

Office Action for Application No. JP2004-262673 mailed on Jun. 26, 2007.

* cited by examiner

*Primary Examiner*—Tuan T Dinh
(74) *Attorney, Agent, or Firm*—Westerman, Hattori, Daniels & Adrian, LLP (57) ABSTRACT

In a power drive unit having power modules (three-phase inverter circuits) connected to a control circuit board, bus bars extending from the power modules and a current sensor each installed near the bus bars and including a sensing element that detects currents outputted from the bus bars, there are provided a sensor board on which the sensing element is mounted, and lead pins each connecting the sensor board to the control circuit board and having a bowed shape whose one end is connected to the sensor board and other end once extends away from the circuit board and then turns back toward the circuit board. With this, the circuit board and current sensors can be connected through the lead pins without increasing the distance therebetween and stress produced in the lead pins can be alleviated, thereby enabling the unit to be minimized in size and utilized in a harsh service environment.

5 Claims, 12 Drawing Sheets

POWER DRIVE UNIT

BACKGROUND OF THE INVENTION

1. Field of the Invention

This invention relates to a power drive unit, more specifically to a power drive unit that is most suitable for use in a hybrid vehicle.

2. Description of the Related Art

The hybrid vehicle that has emerged in various forms in recent years is equipped with an internal combustion engine, electric motor(s), battery or other such energy storage device, and the like. During driving of the hybrid vehicle, the engine and motor(s) are controlled in response to the driving or running conditions of the vehicle (e.g., whether the vehicle drives at high speed or low speed).

The electric motor used in a hybrid vehicle is generally operated by alternating current supplied to its stator from a power drive unit (PDU), more exactly from power modules in the PDU that convert direct current (outputted from a battery or other energy storage device) into alternating current.

In the PDU, alternating currents flowing through bus bars (i.e., bar-like leads) extending from the power modules (specifically, three-phase inverter circuit modules) are detected by current sensors (current detectors) that output signals proportional to the detected alternating currents to a control circuit board (more specifically a control unit mounted on a circuit board). The control unit on the circuit board controls the PDU based on the signals outputted from the current sensors.

In order to reduce the size of the PDU, the distance between the control circuit board and current sensors should preferably be made as small as possible. A widely employed expedient for achieving this is to connect the control circuit board and current sensors through a harness, as taught, for example, in Japanese Laid-Open Patent Application No. Hei 9(1997)-47034, especially FIGS. 1 and 4. However, the PDU of this prior art with a harness disadvantageously increases both the number of components and the number of assembly steps.

This disadvantage can conceivably be overcome by interconnecting the control circuit board and the current sensors through lead pins. In this case, consideration must be given to the harsh environment of the PDU installation site, namely the severe vibration and temperature changes that the PDU experiences.

To cope with this situation, Japanese Laid-Open Patent Application No. Hei 11(1999)-26955 (especially paragraphs 0016 and 0017 and FIG. 1) teaches the control circuit board connected to external devices through lead pins, in which the stress produced in the lead pins can be alleviated by forming a convex curved portion in the vicinity of the intermediate region of the lead pins.

However, when the configuration taught by the second reference ('955) is applied to the PDU, the distance between the control circuit board and current sensors needs to be increased by the size of the curved portion of the lead pins, which is disadvantageous because it makes the overall size of the PDU larger by the amount of the increased clearance.

SUMMARY OF THE INVENTION

An object of the present invention is therefore to overcome the foregoing drawbacks by providing a power drive unit in which the control circuit board and current sensors can be connected through lead pins without increasing the distance therebetween and stress produced in the lead pins and the like can be alleviated, thereby enabling the power drive unit to be minimized in size and utilized in a harsh service environment.

In order to achieve the object, the present invention provides a power drive unit having an electronic circuit board on which a control unit is mounted, power modules connected to the electronic circuit board, bus bars extending from the power modules and a current sensor each installed near the bus bars and each including a sensing element that detects currents outputted from the bus bars, comprising: a sensor board on which the sensing element is mounted; and a lead pin connecting the sensor board to the electronic circuit board and having a bowed shape whose one end is connected to the sensor board and other end once extends away from the electronic circuit board and then turns back toward the electronic circuit board.

BRIEF DESCRIPTION OF THE DRAWINGS

The above and other objects and advantages of the present invention will be more apparent from the following description and drawings in which.

DETAILED DESCRIPTION OF THE PREFERRED EMBODIMENTS

Power drive units according to preferred embodiments of the present invention will now be explained with reference to the attached drawings.

Figure 1:
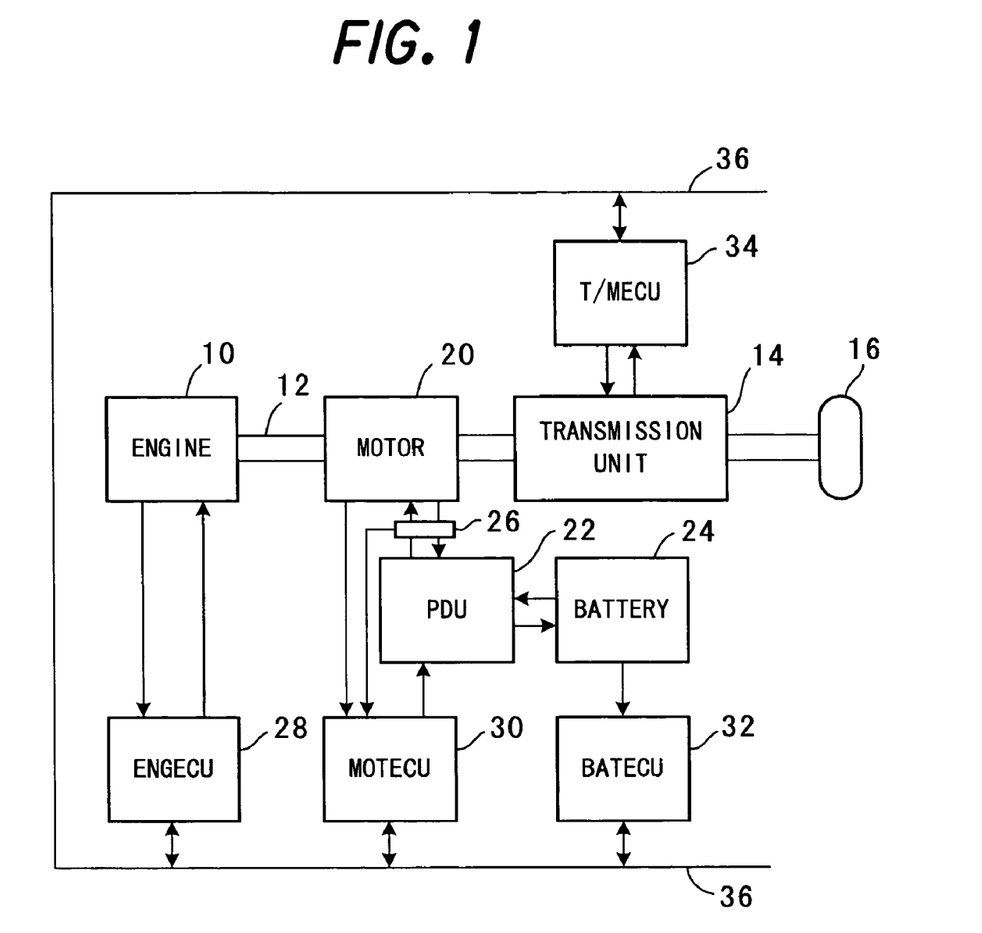
FIG. 1 is a schematic view showing the overall configuration of a hybrid vehicle control system including a power drive unit according to a first embodiment of the present invention.

FIG. 1 is a block diagram showing the overall configuration of a hybrid vehicle control system including a power drive unit according to a first embodiment of the present invention.

Reference numeral 10 in the drawing designates an internal combustion engine. The output of the engine 10 is inputted through a drive shaft 12 to a transmission unit 14. The engine 10 is a gasoline-injection, spark-ignition, four-cylinder engine. The transmission unit 14 is an automatic transmission and connected to driven wheels 16 (only one shown) of the hybrid vehicle (not shown) on which the engine 10 is mounted. The transmission unit 14 changes the speed of the engine rotation and transmits it to the driven wheels 16 for running the hybrid vehicle.

The drive shaft 12 is connected with or passes through an electric motor 20 between the engine 10 and the transmission unit 14. The engine 10 is started by supplying cranking current to the motor 20 and cranked by the motor, whereafter the motor 20 rotates so long as the engine 10 continues to run. The motor 20 is also supplied with current during acceleration to assist (speed up) the rotation of the engine 10. When the motor 20 is not being supplied with current, it rotates idly with the rotation of the engine 10. When the supply of fuel to the engine 10 is stopped during deceleration (fuel cutoff is implemented), the motor 20 converts the kinetic energy produced by rotation of the drive shaft 12 into electric energy and outputs the electric energy, thus operating as a generator that functions to regenerate or recover energy.

The motor 20 is connected through a power drive unit (PDU) 22 to a battery (energy storage device) 24. The motor 20 comprises a DC brushless motor, i.e., an alternating current synchronous motor. The PDU 22, which is equipped with power modules (specifically, three-phase inverter circuits) as will be explained further later, converts direct current (electric power) supplied from or discharged by the battery 24 into alternating current which it supplies to the motor 20. It also converts alternating current generated by the energy regenerating operation of the motor 20 into direct current that it supplies to the battery 24 to charge the same. Thus in the illustrated hybrid vehicle control system, the driving/regenerating operation of the motor 20 is controlled through the PDU 22. The battery 24 is composed of a suitable number of nickel-hydrogen (Ni-MH) cells connected in series.

A current sensor(s) (current detector(s)) 26 is interposed between the PDU 22 and motor 20, and outputs signals proportional to the current outputted or supplied from the PDU 22 to the motor 20.

As illustrated, the hybrid vehicle control system includes an engine electronic control unit (ENGECU) 28 that controls the operation of the engine 10 and a motor electronic control unit (MOTECU) 30 that controls the operation of the motor 20 based on the outputs of the current sensors 26. Also included are a battery electronic control unit (BATECU) 32 that calculates the state of charge (SOC) of the battery 24 and performs functions such as charge/discharge management, and a transmission electronic control unit (T/MECU) 34 that controls operation of the transmission unit 14. The ENGECU 28 and other electronic control units (ECUs) comprise microcomputers and are connected with each other to communicate or exchange data via a bus 36.

Figure 2:
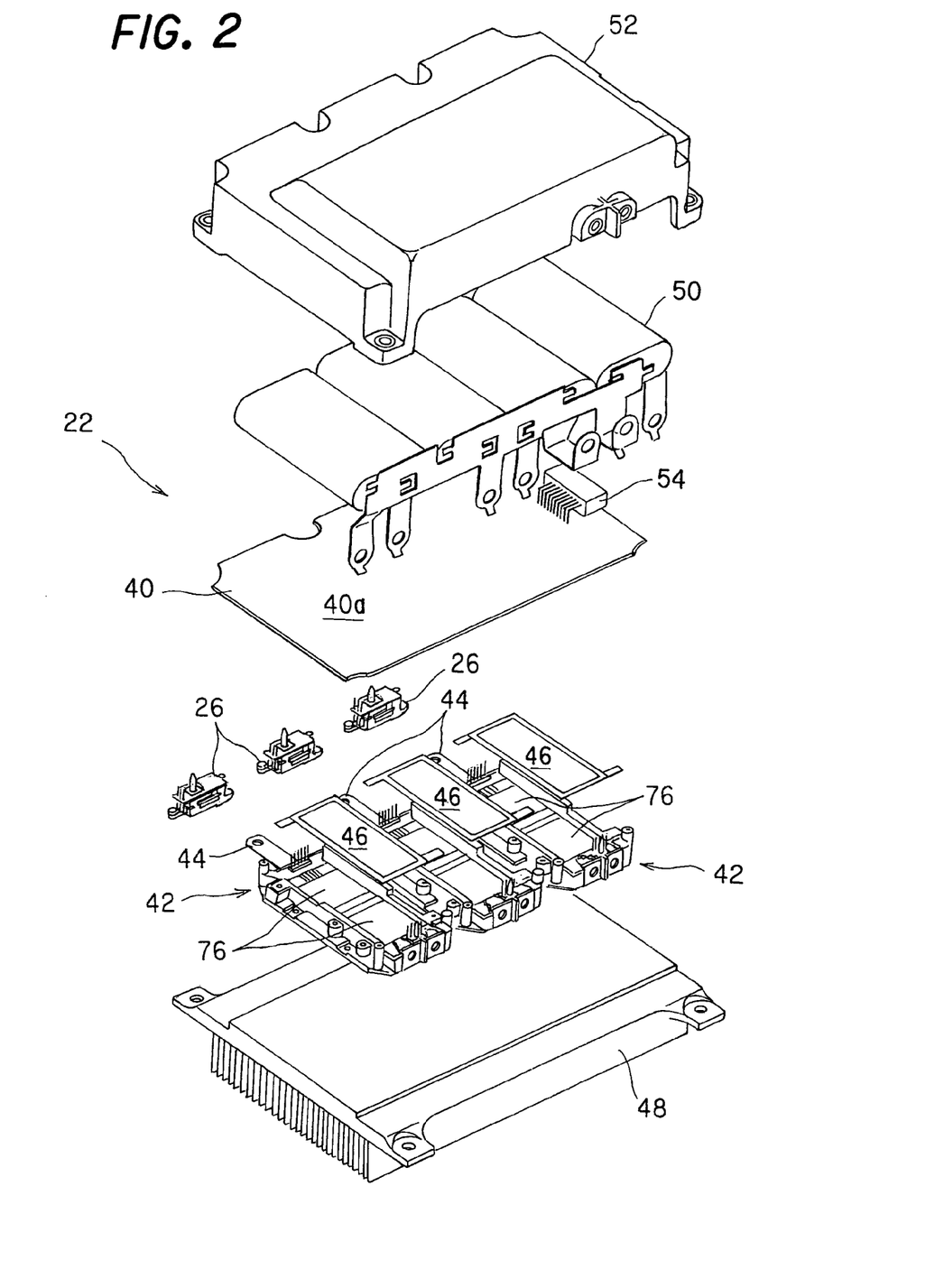
FIG. 2 is an exploded perspective view showing a specific structure of the power drive unit schematically shown in FIG. 1.

The PDU 22 will now be explained in detail. FIG. 2 is an exploded perspective view showing a specific structure of the power drive unit schematically shown in FIG. 1.

As illustrated, the PDU 22 comprises a single control circuit board (electronic circuit board) 40 on which the MOTECU 30 and so forth (neither shown) are to be mounted, three power modules (now assigned with reference numeral 42) of three-phase inverter circuits connected to the control circuit board 40, three bus bars (bar-like leads) 44 each extending from the respective power modules 42 and projecting in a direction parallel to the power modules 42 (horizontally in FIG. 2), three shield plates 46 each interposed between the control circuit board 40 and the respective power modules 42, three current sensors 26 each including a sensing element installed near the respective bus bars 44 to detect the outputs from the associated one of the bus bars 44, a heat sink 48 attached to the power modules 42 and the like that promotes radiation of heat therefrom, a smoothing capacitor 50 used in a smoothing circuit, and a PDU case 52 that accommodates the control circuit board 40, power modules 42, shield plates 46, heat sink 48, smoothing capacitor 50 and other components.

A connector 54 for connection with an external ECU (electronic control unit; not shown) is mounted on an upper surface 40a of the control circuit board 40. Other components are also mounted on the control circuit board 40 and so forth but are omitted in FIG. 2 to make the illustration simpler. Through-holes and the like formed in the control circuit board 40, to be explained later, are also omitted in the drawing.

Figure 3:
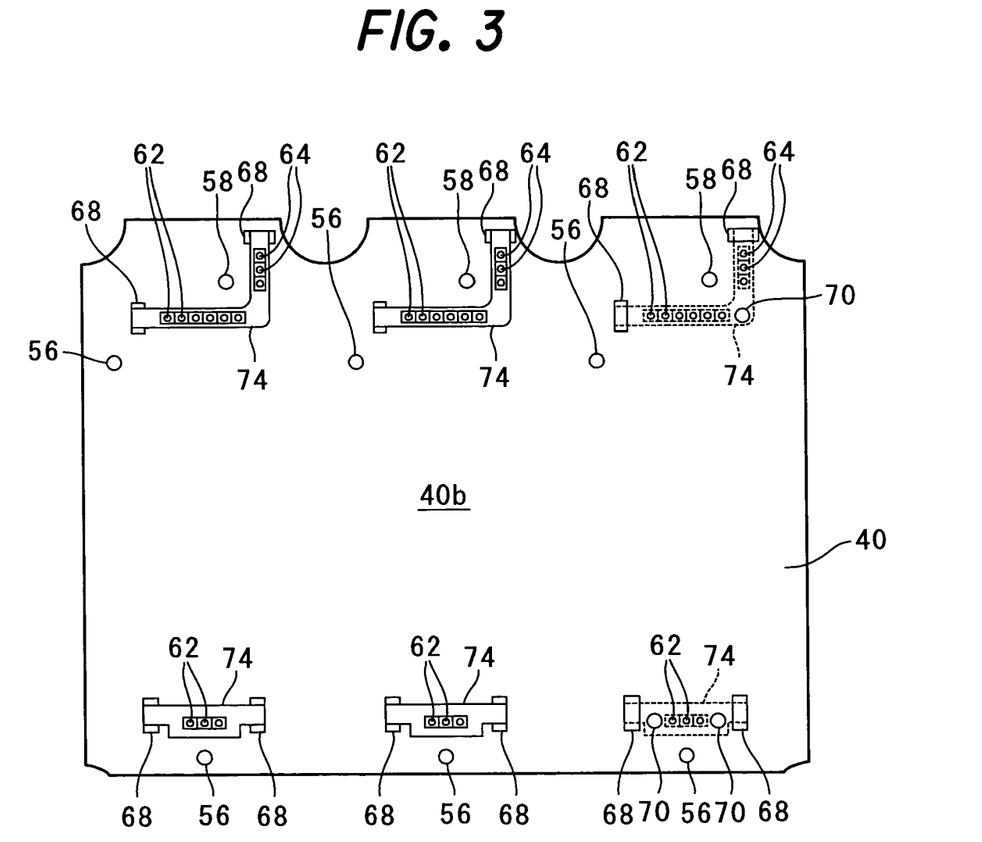
FIG. 3 is a view showing a lower or bottom surface of a control circuit board shown in FIG. 2.

FIG. 3 is a view showing a lower or bottom surface 40b of the control circuit board 40, i.e., the side facing the power modules 42 etc.

As shown in FIG. 3, the control circuit board 40 is formed at appropriate locations with six insert-holes 56 (hereinafter referred to "first insert-holes") through which six locating (or positioning) pins (hereinafter referred to "first locating pins") provided on the power modules 42 are to be inserted, and three insert-holes 58 (hereinafter referred to as "second insert-hole") through which three locating (or positioning) pins (hereinafter referred to as "second locating pins") provided on the current sensors 26 are to be inserted. The control circuit board 40 is further formed with twenty-seven through-holes 62 (hereinafter referred to as "first through-holes") through which signal pins of the power modules 42 in the corresponding number are to be inserted, and nine through-holes 64 (hereinafter referred to as "second through-holes") through which lead pins of the current sensors 26 are to be inserted.

The control circuit board 40 is further formed with twelve engagement holes 68 that are to be engaged with snap-fittings of pin guides (second guides), and nine insert-holes 70 (hereinafter referred to as "third insert-holes") through which nine locating (or positioning) pins of the pin guides (hereinafter referred to as "third locating pins") are to be inserted. These pins will be explained later.

The pin guides (now assigned with reference numeral 74) are installed on the lower surface 40b of the control circuit board 40 near the first and second through-holes 62, 64. Although the pin guides 74 are of two shapes in planar view (I-shaped and L-shaped), their shape is not a significant factor and can be appropriately selected. The following explanation will be made taking one I-shaped pin guide 74 as an example.

Figure 4:
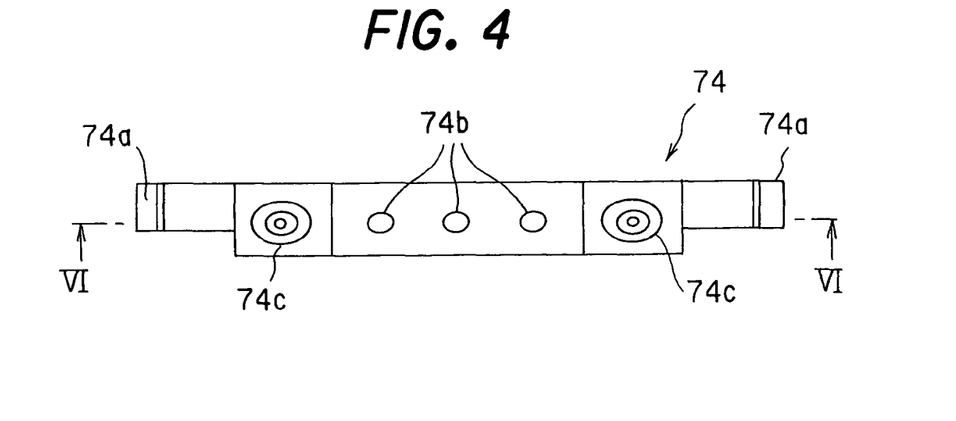
FIG. 4 is an enlarged plan view of a pin guide shown in FIG. 3.
Figure 5:
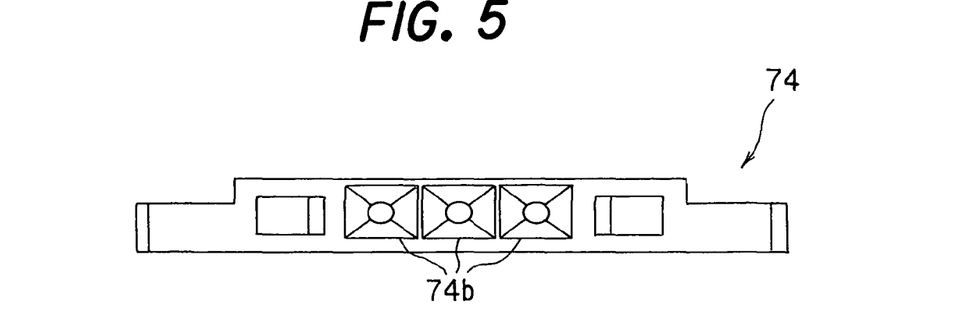
FIG. 5 is an enlarged bottom view of the pin guide shown in FIG. 3.
Figure 6:
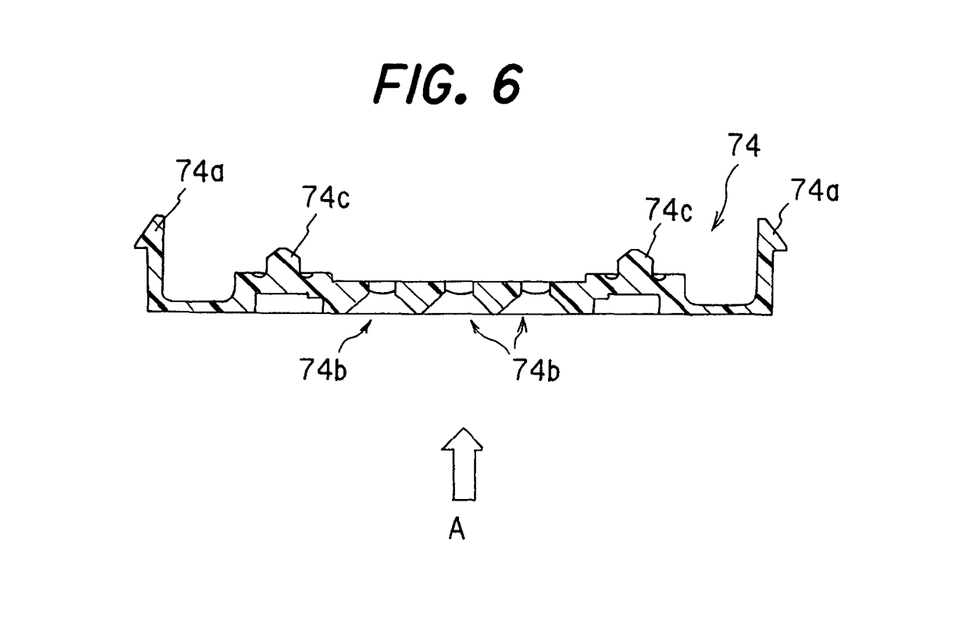
FIG. 6 is a sectional view taken along line VI-VI in FIG. 4.

FIG. 4 is an enlarged plan view of the one pin guide 74 shown in FIG. 3, FIG. 5 is a bottom view thereof, and FIG. 6 is a sectional view taken along line VI-VI in FIG. 4.

The pin guide 74 is made of resin. As shown in FIGS. 4 and 5, its opposite end portions are formed with elastically deformable snap-fit lugs 74a (referred to the above) for engagement with the engagement holes 68 formed in the control circuit board 40. The pin guide 74 is formed at an appropriate location with insert sections 74b for receiving the aforesaid signal pins of an associated one of the power modules 42. The entrances of the insert sections 74b (inlets in the direction of signal pin insertion (direction of the arrow A in FIG. 6)) are tapered to facilitate insertion of the signal pins.

The L-shaped pin guides 74 are also formed with insert sections of substantially the same shape as the insert sections 74b.

The aforesaid third locating pins 74c are provided on the upper surface (facing the lower surface 40b of the control circuit board 40) of the pin guides 74 at two or more locations (two locations in this embodiment) to project therefrom. As best shown in FIG. 6, the third locating pins 74c are decreased in diameter toward their tips so that their upper ends are given the shape of truncated cones. The L-shaped pin guides 74 are each formed with only a single number of the third locating pin 74c.

As shown in FIG. 2, each power module 42 is equipped with an IGBT (Insulated-Gate Bipolar Transistor) 76 that constitutes the three-phase inverter circuit, whereby it is configured as the three-phase circuit module. The shield plates 46 are each provided above the IGBT 76 to block electromagnetic waves.

Figure 7:
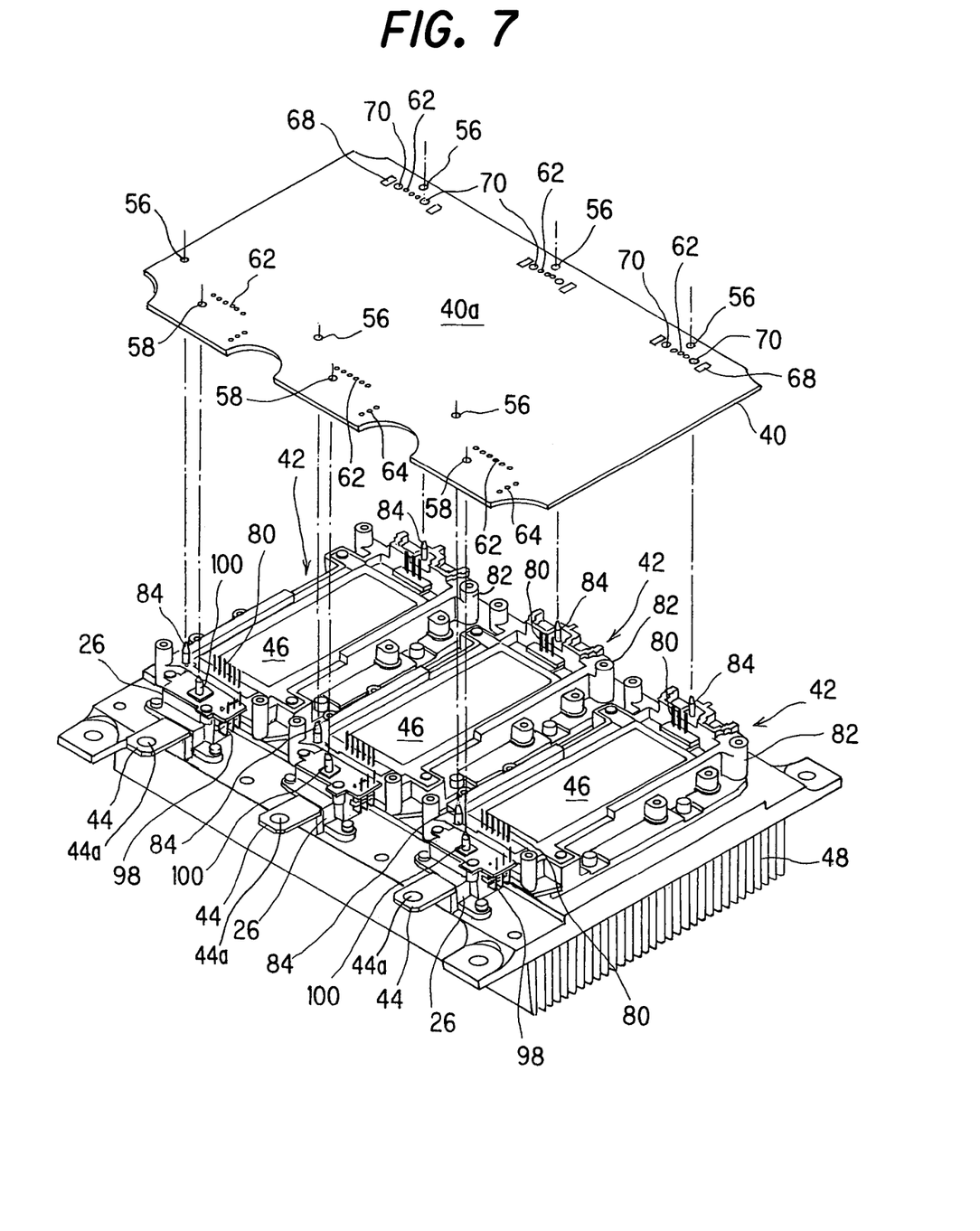
FIG. 7 is a perspective view showing power modules and current sensors to be fastened to the control circuit board and a heat sink shown in FIG. 2.

FIG. 7 is a perspective view showing the power modules 42 and current sensors 26 to be fastened to the control circuit board 40 and heat sink 48.

As shown in FIG. 7, the three power modules 42 are each formed at appropriate locations with twenty-seven signal pins 80 that pass through the first through-holes 62 of the control circuit board 40, i.e., that are connected to the control circuit board 40. In the respective power modules 42, The IGBT 76 and shield plate 46 are enclosed by housing cases 82. The housing cases 82 are each made of resin and the aforesaid first locating pins (now assigned with reference numeral 84) rise integrally from their upper surfaces (surface facing the control circuit board 40) at their opposite ends in the longitudinal direction. Specifically, two of the first locating pins 84 are provided to project from the associated housing case 82, so the total number of the first locating pins 84 is six as mentioned in the above. The first locating pins 84 are decreased in diameter toward their tips so that their upper ends are given the shape of truncated cones.

The bus bars 44 extending from the power modules 42 are connected with the motor 20 and, for enabling this connection, are each formed with a connecting hole 44a for permitting coupling with a member to be connected with the motor 20.

Figure 8:
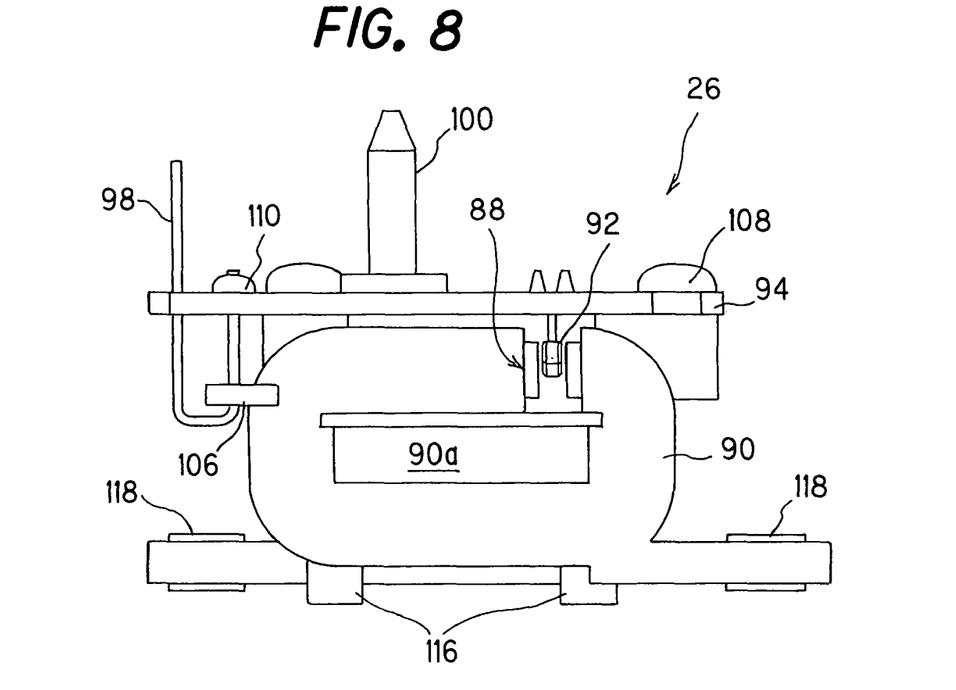
FIG. 8 is an enlarged front view of the current sensor shown in FIG. 2.
Figure 9:
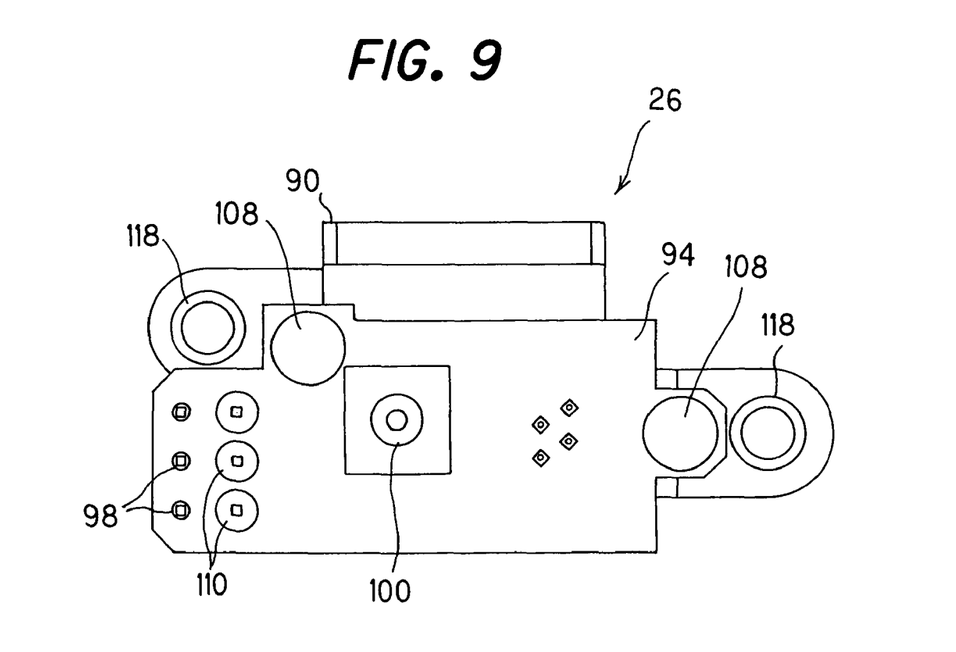
FIG. 9 is an enlarged plan view of the current sensor shown in FIG. 8.
Figure 10:
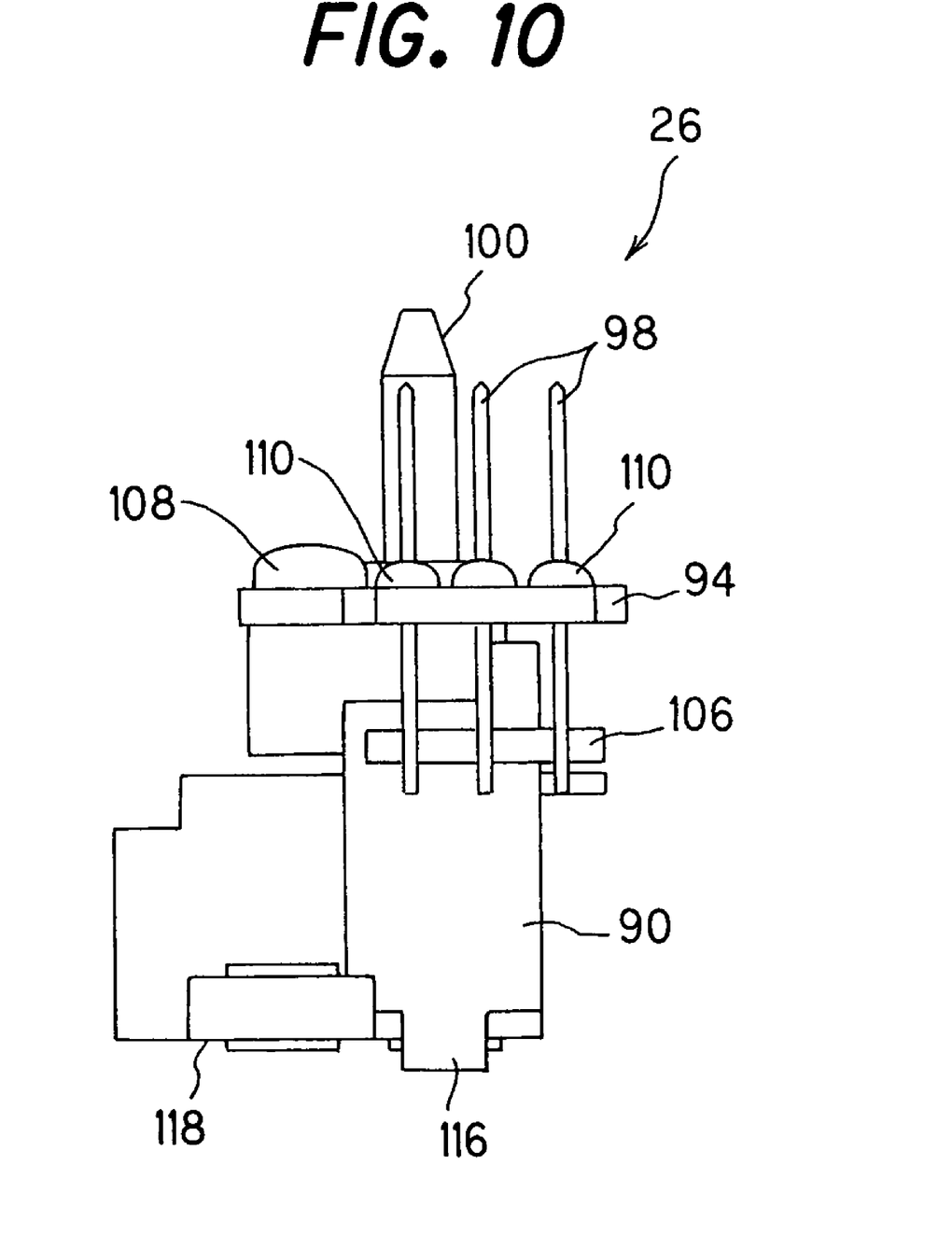
FIG. 10 is an enlarged side view of the current sensor shown in FIG. 8.

The three current sensor 26 associated with each power module 42 are installed near the respective ones of the bus bar 44. FIG. 8 is an enlarged front view of one current sensor 26, FIG. 9 is an enlarged plan view thereof, and FIG. 10 is an enlarged side view thereof.

As illustrated, each current sensor 26 comprises a generally C-shaped magnetic core having a gap 88, a cover 90 made of resin that covers the magnetic core, a sensing element 92 comprising a Hall element or other magnetoelectric device inserted in the gap 88, and a sensor board 94 on which the sensing element 92 and an amplifier for amplifying output are mounted thereon.

The associated bus bar 44 passes through a bus bar insert section 90a located at the middle of the magnetic core of the current sensor 26. When electric current passes through the bus bar 44, the resulting magnetic field generated in the gap 88 of the current sensor 26 is converted into a voltage signal by the sensing element 92. This voltage signal is amplified by the amplifier and is outputted as a signal proportional to the output current of the associated bus bar 44. This signal is outputted through lead pins 98 that are provided on the sensor board 94 of the current sensor 26 and pass through associated ones of the second through-holes 64 of the control circuit board 40.

An associated one of the aforesaid second locating pins (now assigned with reference numeral 100) is provided to project from the upper surface of the corresponding current sensor 26 (surface facing the control circuit board 40), specifically from an appropriate location of the sensor board 94. Each second locating pin 100 is decreased in diameter toward its tip so that its upper end is given the shape of a truncated cone.

Figure 11:
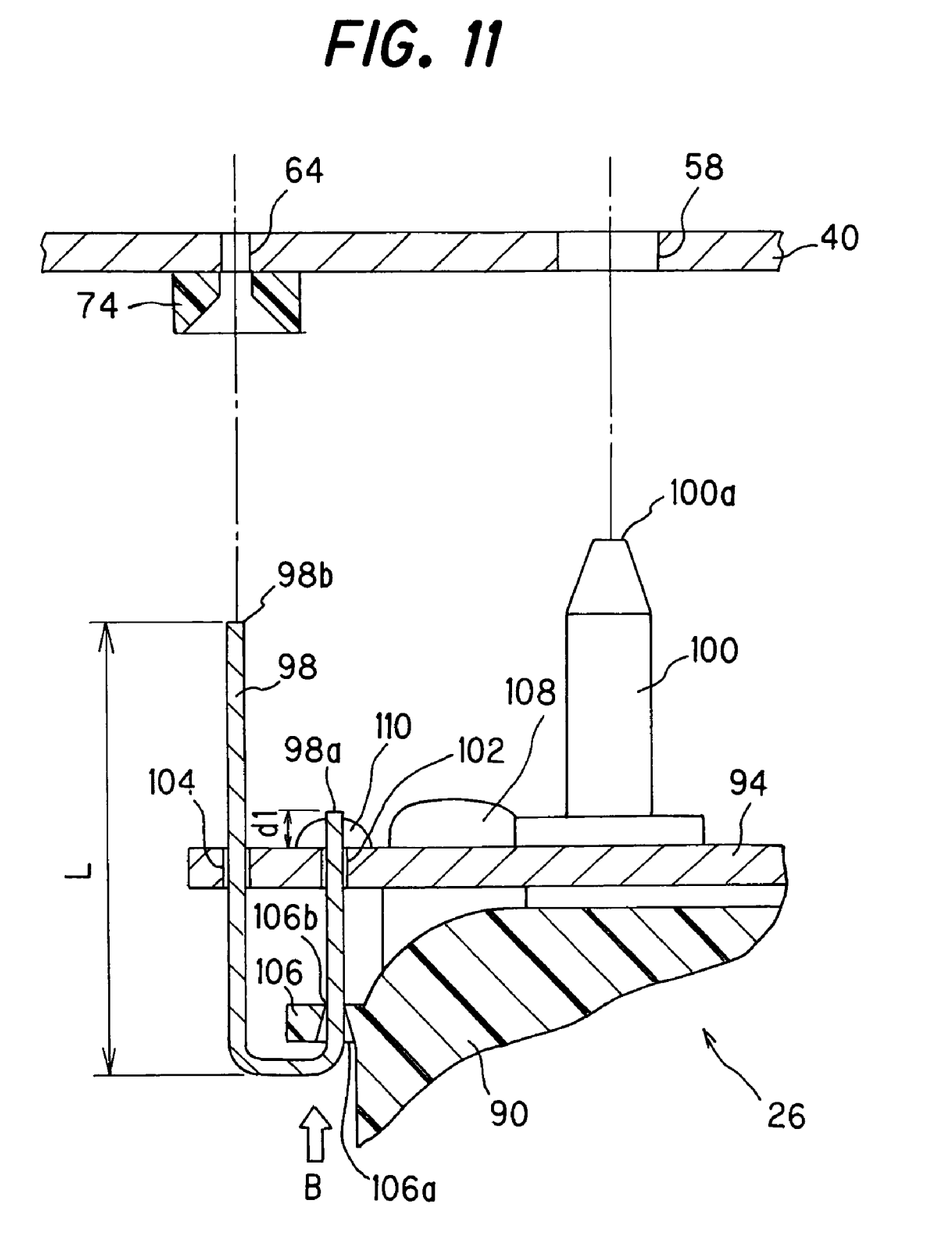
FIG. 11 is a partial enlarged sectional view showing the control circuit board shown in FIG. 2 and the vicinity of a lead pin of the current sensor.

The lead pins 98 that are characterizing features of this invention will be explained in detail. FIG. 11 is a partial enlarged sectional view showing one lead pins 98 and the regions of the control circuit board 40 and associated current sensor 26 in the vicinity thereof.

As shown in FIG. 11, the lead pin 98 has a sectional shape like a backward letter J. The long side of the lead pin 98 (designated L in FIG. 11) is given such a shape that when the lead pin 98 is fastened at a predetermined position its distal end is located lower than the tip 100a of the second locating pin 100 provided on the sensor board 94.

The sensor board 94 of each current sensor 26 is formed with three through-holes 102, 104 for passing the lead pins 98. Of these six through-holes, the through-holes 102 nearer the current sensor 26 (on the right side in FIG. 11) will be called the "third through-holes" and the through-holes 104 on the left side will be called the "fourth through-holes."

A lead pin fastener-guide (first guide) 106 that guides and fastens the lead pin 98 is provided in association with each lead pin 98 at an appropriate location of the current sensor 26 beneath the sensor board 94 as viewed in FIG. 11. The lead pin fastener-guide 106 projects laterally from the side face of the cover 90 and, like the cover 90, is made of resin. The lead pin fastener-guides 106 and current sensor 26 (more exactly, the cover 90) are formed integrally.

Each lead pin fastener-guide 106 is formed with three insert sections 106a (only one is shown in FIG. 11) adapted for insertion of the associated lead pin 98 and coaxially aligned with the center axes of the associated third through-holes 102. The entrances of the insert sections 106a (inlets in the direction of insertion of the lead pin 98 (indicated by the arrow B in FIG. 11)) are each tapered to facilitate insertion of the lead pin 98. The diameters of their exits 106b of the insert sections 106a are each approximately equal to the diameter of the lead pin 98, namely, slightly larger than the diameter of the lead pin 98.

The connection or assembly of the cover 90, lead pin 98 and sensor board 94 of the current sensor 26 will be explained.

First, the one end 98a of the lead pin 98 is inserted into the insert sections 106a of the associated lead pin fastener-guide 106 in the direction of the arrow B in FIG. 11. As mentioned above, the diameter of the exits 106b of the insert sections 106a are about the same as the diameter of the lead pin 98, so that the lead pin 98 pressed in the direction of the arrow B advances to a predetermined position. The lead pin 98 is pinched by the exits 106b of the lead pin fastener-guide 106 to be immobilized.

Next, the sensor board 94 is connected to the lead pin 98 and cover 90. Specifically, the sensor board 94 is positioned above the lead pin 98 as viewed in FIG. 11 and then moved toward the lead pin 98 until the associated fourth through-holes 104 of the sensor board 94 receive the other end 98b of the lead pin 98, whereupon the lead pin 98 passes into the fourth through-holes 104.

After the lead pin 98 has entered the fourth through-holes 104, downward movement of the sensor board 94 is continued. Presently, the third through-holes 102 of the sensor board 94 receive the one end 98a, whereupon the lead pin 98 passes into the third through-holes 102. At the point where the lead pin 98 comes to project from the third through-holes 102 by a predetermined distance d1, the movement of the sensor board 94 is stopped.

Next, the sensor board 94 is connected to the cover 90 by two connecting pins 108 (only one shown) and the one end 98a of the lead pin 98 is fastened to the sensor board 94 by soldering. The connection (i.e., solder joint) is designated 110.

Thus, each lead pin 98 of the current sensor 26 has a bowed shape (sectional shape like a backward letter J) whose one end 98a is connected to the sensor board 94 and whose other end 98b once extends away from the control circuit board 40 and then turns back toward the control circuit board 40.

Figure 12:
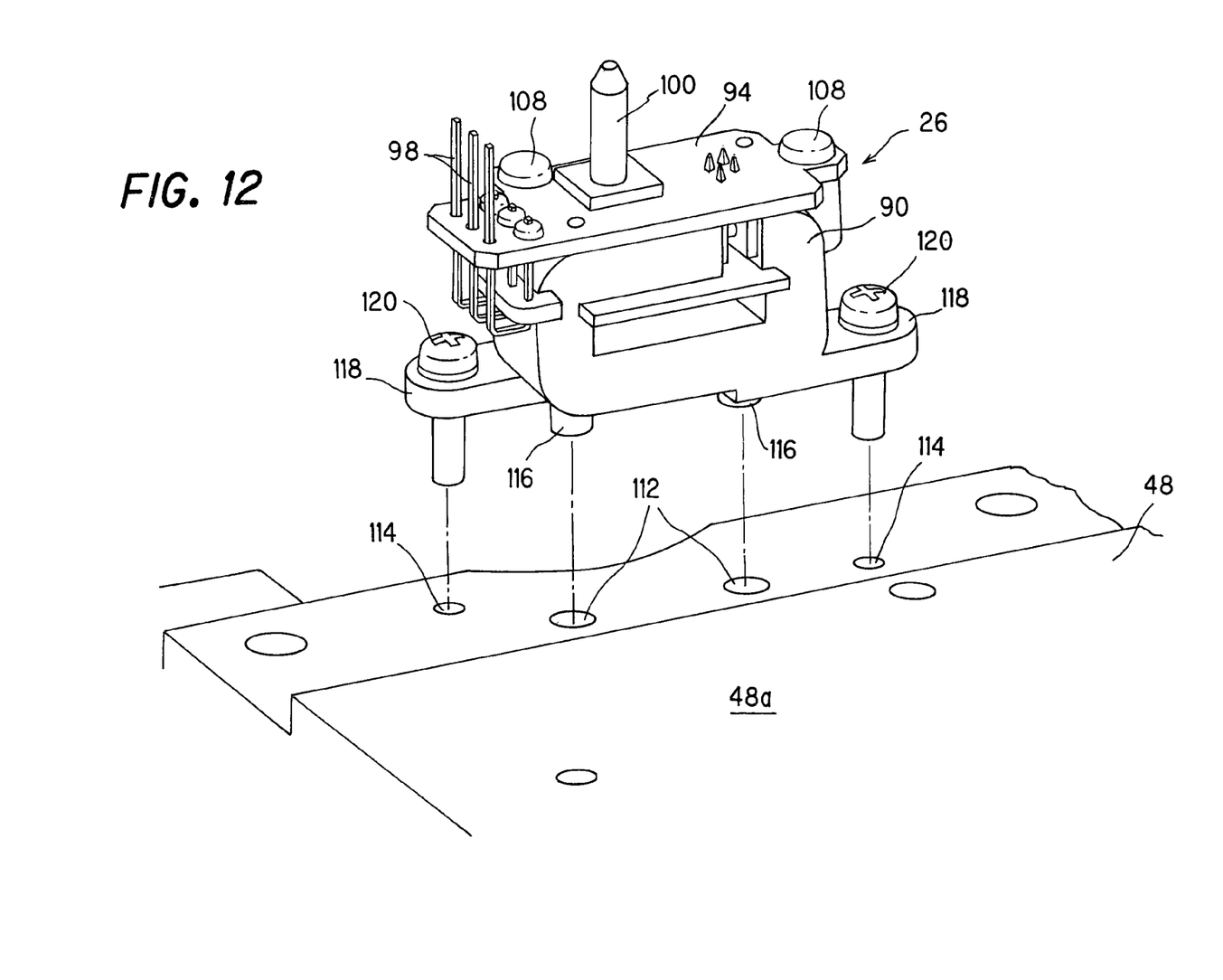
FIG. 12 is an enlarged perspective view showing the heat sink and one of the current sensors shown in FIG. 2 being assembled.

The connection or assembly of the heat sink 48, power modules 42 and current sensors 26 will be briefly explained.

FIG. 12 is an enlarged perspective view showing the heat sink 48 and one of the current sensors 26 being assembled.

A plurality of indentations 112 and screw holes 114 (two of each visible in FIG. 12) are formed in the upper surface 48a of the heat sink 48 (surface on which the current sensors 26 and the like are attached) at locations where the current sensors 26 are to be fastened. The screw holes 114 are threaded with female screws.

On the other hand, the underside of each of the current sensors 26, more exactly each cover 90, i.e., the side surface thereof in contact with the heat sink 48, is formed with two protrusions 116 to be fitted in the associated indentations 112 and insert-hole lugs 118 formed with insert holes for insertion of screws. Therefore, the current sensor 26 can be positioned by fitting its protrusions 116 into the indentations 112 of the heat sink 48, whereafter the current sensor 26 and heat sink 48 can be assembled by passing screws 120 through the insert-holes 118 and screwing them into the screw holes 114. The heat sink 48 and power modules 42 are assembled by a similar fastening method.

The assembly of the control circuit board 40, power modules 42 and current sensors 26 will now be explained with reference to FIG. 7.

After the power modules 42 have been positioned, they are screwed to the heat sink 48 and immobilized. Next, the bus bars 44 extending from the power modules 42 are passed through the current sensors 26 (more exactly, the bus bar insert sections 90a thereof), and after the current sensors 26 have been positioned as explained above, they are screwed to the heat sink 48 and immobilized.

Next, control circuit board 40, power modules 42 and current sensors 26 are assembled. At this point, it is assumed that the pin guides 74 have already been mounted on the lower surface 40b of the control circuit board 40. In other words, third locating pins 74c of the pin guides 74 have been inserted into the third insert-holes 70 of the control circuit board 40 and the snap-fit lugs 74a have been engaged with the engagement holes 68.

Figure 13A:
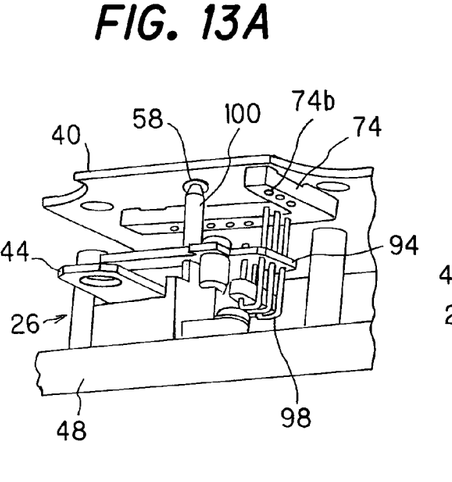
FIGS. 13A and 13B are partial enlarged perspective views showing the state of assembly in the vicinity of the control circuit board shown in FIG. 2 and the lead pins of one of the current sensors.
Figure 13B:
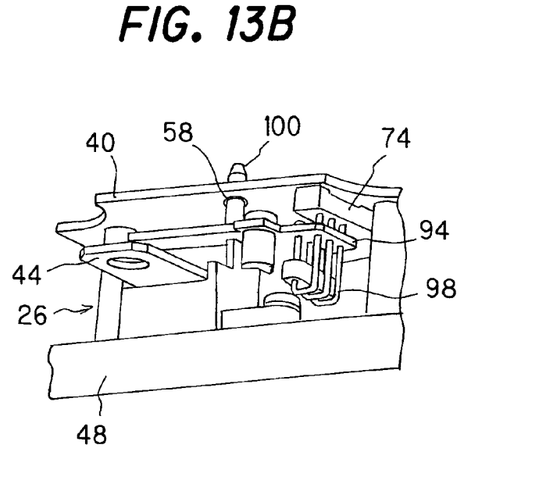

FIGS. 13A and 13B are partial enlarged perspective views showing the state of assembly in the vicinity of the control circuit board 40 and the lead pins 98 of one of the current sensors 26.

As shown in FIG. 13A, the second locating pin 100 of the current sensor 26 is inserted into the associated second insert-hole 58 of the control circuit board 40. Next, as shown in FIG. 13B the lead pins 98 of the current sensor 26 are inserted into the insert sections 74b of the associated second pin guide 74. The control circuit board 40 and lead pins 98 are then soldered to assemble the control circuit board 40 with the current sensor 26. The control circuit board 40 and power modules 42 are assembled by a similar method.

As explained in the foregoing, the control circuit board 40 is positioned with respect to the power modules 42 and current sensors 26 and is connected to the power modules 42 and current sensors 26 through the signal pins 80 and lead pins 98.

The first embodiment is thus configured to have a power drive unit (PDU 22) having an electronic circuit board (control circuit board 40) on which a control unit (such as MOTECU 30, etc.) is mounted, power modules (42) connected to the electronic circuit board, bus bars (44) extending from the power modules and a current sensor (26) each installed near the bus bars and each including a sensing element (92) that detects currents outputted from the bus bars, comprising: a sensor board (94) on which the sensing element is mounted; and a lead pin (98) connecting the sensor board to the electronic circuit board and having a bowed shape whose one end is connected to the sensor board and other end once extends away from the electronic circuit board and then turns back toward the electronic circuit board. Specifically, the sensor board 94 is formed with a first hole (third through-holes 102) and a second hole (fourth through-holes 104) through which the lead pin passes to have the bowed shape such that one end is connected to the sensor board and other end is once extends away from the electronic circuit board and then turns back toward the electronic circuit board.

This configuration enables the electronic circuit board (control circuit board 40) and the current sensors 26 to be connected without increasing the distance or clearance between them. It also makes it possible to alleviate vibration-induced stress arising in the lead pins 98 and so forth, particularly that arising in the lead pins 98, the joints (solder joints 110) between the lead pins 98 and the sensor boards 94 and the joints between the lead pins 98 and the control circuit board 40. The power drive unit can therefore be minimized in size and made capable of use in a harsh service environment.

The current detection units (26) are further provided with the first guides (lead pin fastener-guides 106) for guiding and fastening the lead pins 98. Specifically, the first guide is formed with a third hole (insert sections 106a) coaxially aligned with the first hole, and an entrance of the third hole is tapered to facilitate insertion of the lead pin, while an exit of the third hole is made slightly larger than a diameter of the lead pin to pinch the lead pin.

This facilitates the insertion of the lead pins 98 at the time of assembling the lead pins 98 and sensor boards 94 and also facilitates positioning of the sensor boards 94 and lead pins 98 during soldering. The lead pins 98 and sensor boards 94 can therefore be readily connected. Moreover, only a portion of each lead pin 98 is guided, so that it becomes possible to minimize vertical and lateral stress produced in the lead pins 98 and the like by, for example, vibration, particularly stress arising in the joints involving the lead pins 98, and especially stress arising in the joints (solder joints 110) between the lead pins 98 and the sensor boards 94 of the current sensors. The power drive unit can therefore be minimized in size and made capable of use in a harsh service environment.

The electronic circuit board (40) is further provided with the second guides (pin guides 74) for guiding the lead pins 98.

This enables the assembly of the control circuit board 40 and current sensors 26 to be performed still more easily, without causing damage to the lead pins 98.

A power drive unit according to a second embodiment of the invention will now be explained with particular focus on the current sensors of the power drive unit.

Figure 14:
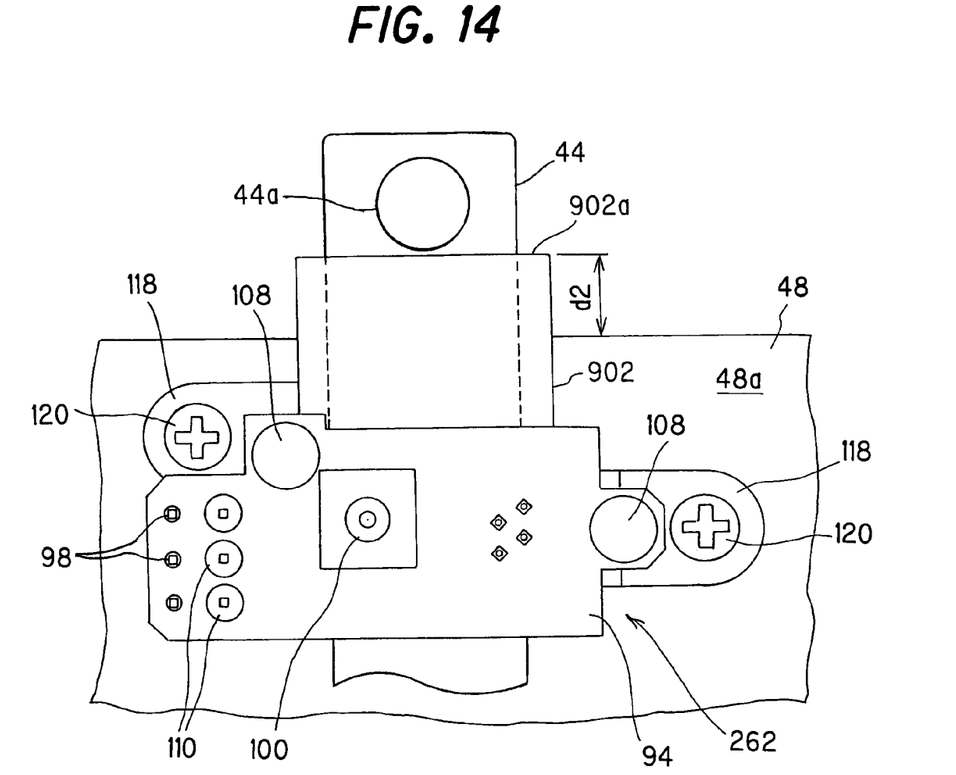
FIG. 14 is a partial enlarged plan view showing a power drive unit according to a second embodiment of the present invention and illustrating a current sensor fastened to the heat sink.
Figure 15:
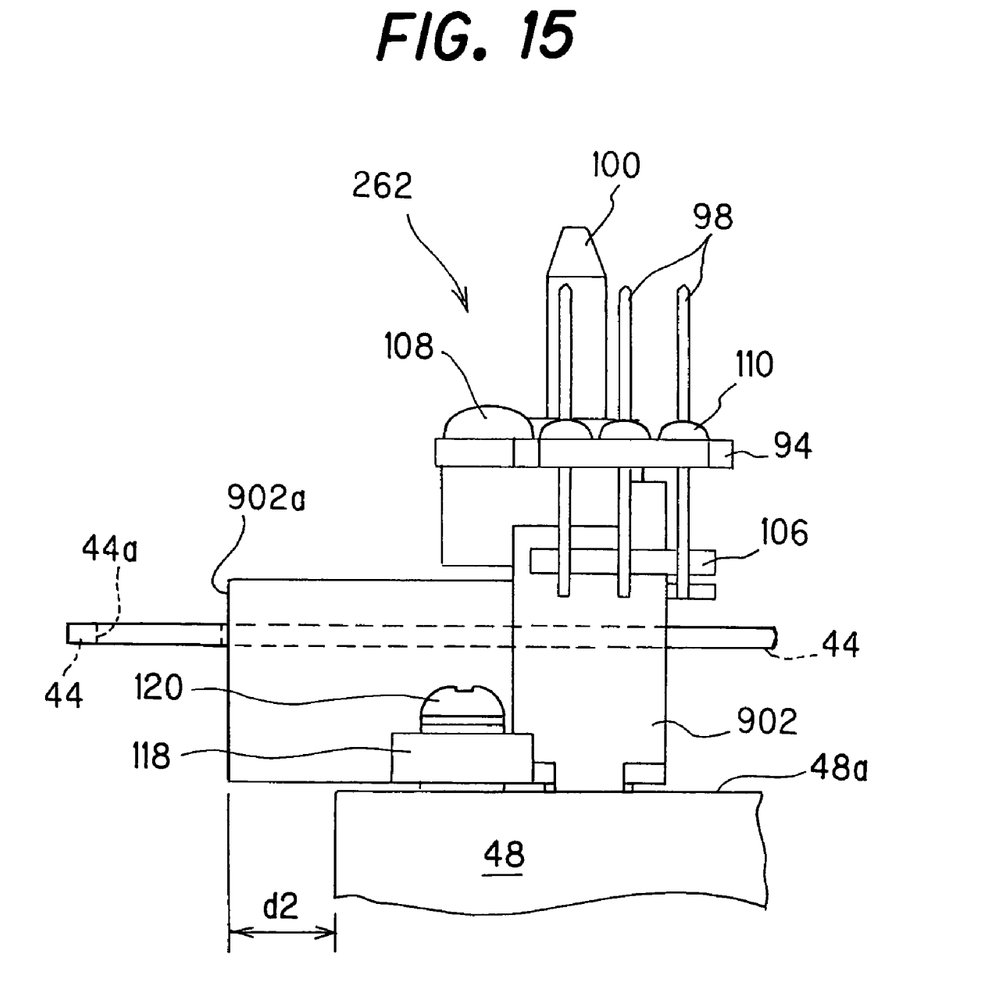
FIG. 15 is an enlarged partial side view of the current sensor shown in FIG. 14.

FIG. 14 is a partial enlarged plan view showing a power drive unit according to a second embodiment of the present invention and illustrating the current sensor 26 fastened to the heat sink 48 and FIG. 15 is an enlarged side view of the portion shown in FIG. 14. The power modules 42 and other components are omitted from the drawing in the interest of simplicity.

As pointed out above, the bus bars 44 extending from the power modules 42 pass alternating current supplied to the motor 20. This alternating current is often of a relatively high voltage.

In the first embodiment, the bus bars 44 project in parallel with the upper surface 48a of the heat sink 48 (horizontally as viewed in the drawings), so that the gaps or distances between the bus bars 44 and the upper surface 48a of the heat sink 48 are relatively narrow.

Although the bus bars 44 and heat sink 48 configured in this manner are usually insulated from each other by making a certain gas present in the intervening gaps, the gas experiences dielectric breakdown when alternating current of high voltage passes through the bus bars 44, thereby establishing a conductive state to cause current flow by what is called "gas discharge." A slight amount of current may therefore flow to the heat sink 48.

In addition to promoting radiation of heat from the power modules 42 and other components, the heat sink 48 is further connected to portions of the electronic circuitry and also attached to the vehicle body (not shown) to serve as a ground. The passage of a small current into the heat sink 48 may therefore affect the electronic circuitry.

Moreover, since the bus bars 44 are inserted into the bus bar insert sections 90a of the current sensors 26 in the first embodiment, the amplifiers and other electronic components mounted on the sensor boards 94 of the current sensors 26 are liable to be affected by the aforesaid gas discharge.

In the second embodiment, therefore, the bus bar insert section 902a of the cover 902 of each current sensor (now assigned with reference numeral 262) is extended horizontally outward (away from the associated power module 42) by a predetermined distance (designated "d2" in FIGS. 14 and 15). To be more specific, as shown in FIGS. 14 and 15, the region of the associated bus bar 44 other than the region of the connecting hole 44a is covered by the bus bar insert section 902a. In other words, only the region of the bus bar 44 formed with the connecting hole 44a is exposed.

Owing to this structure adopted in the second embodiment of this invention, the gaps between the bus bars 44 and the upper surface 48a of the heat sink 48 are shielded or insulated by the bus bar insert sections 902a, so that no current flows to the heat sink 48 even if gas discharge occurs. Adverse effect to the electronic circuitry connected to the heat sink 48 can therefore be prevented.

In addition, the gaps between the bus bars 44 and the amplifier and other electronic components mounted on the sensor boards 94 are also shielded (insulated) by the bus bar insert sections 902a, so that adverse effect to the electronic components of the current sensors 262 can be prevented even if gas discharge occurs.

Since only the region of the connecting holes 44a of the bus bars 44 are exposed, the members for connection with the motor 20 can be joined with the bus bars 44 utilizing the connecting holes 44a without making the assembly work any more difficult.

The second embodiment is the same as the first in other aspects and also provides the same effects as the first embodiment.

In the foregoing, the power modules 42 are described as being configured as three-phase circuit modules by use of the IGBTs 76. This is not a limitation, however, and the three-phase circuit modules can instead be constituted of IGBTs and gate drive circuits for driving the IGBTs.

Further, the pin guides 74 are described as being I-shaped and L-shaped in planar view. This is not a limitation, however, and the pin guides 74 may naturally be given appropriate shapes matched to the arrangement (layout) of the connection terminals (lead pins and signal pins).

Moreover, the battery 24 composed of nickel-hydrogen cells is exemplified as the energy storage device. This is not a limitation, however, and the device can instead be another kind of battery or a capacitor.

Although the power drive unit is explained with reference to application in a hybrid vehicle, the power drive unit of this invention can also be applied to an electric automobile.

In the second embodiment, the whole of the bus bar insert sections 902a of current sensors 262 is extended. However, it is possible instead to extend only the upper half region of the bus bar insert sections 902a so as only to prevent adverse effect to the electronic components of the current sensors 26 or to extend only the lower half region of the bus bar insert sections 902a so as only to prevent adverse effect to the electric circuitry connected to the heat sink 48 caused by small current flowing to the heat sink 48.

Japanese Patent Application No. 2004-262673 filed on Sep. 9, 2004, is incorporated herein in its entirety.

While the invention has thus been shown and described with reference to specific embodiments, it should be noted that the invention is in no way limited to the details of the described arrangements; changes and modifications may be made without departing from the scope of the appended claims.

What is claimed is:

1. A power drive unit having an electronic circuit board on which a control unit is mounted, power modules connected to the electronic circuit board, bus bars extending from the power modules and a current sensor each installed near the bus bars and each including a sensing element that detects currents outputted from the bus bars, comprising:
   a sensor board on which the sensing element is mounted; and
   a lead pin connecting the sensor board to the electronic circuit board and having a bowed shape whose one end is connected to the sensor board and other end once extends away from the electronic circuit board and then turns back toward the electronic circuit board,
   wherein the sensor board is formed with a first hole and a second hole through which the lead pin passes to have the bowed shape such that one end is connected to the sensor board and other end is once extends away from the electronic circuit board and then turns back toward the electronic circuit board.

2. The power drive unit according to claim 1, wherein the current sensor has a first guide that guides and fastens the lead pin to the sensor board.

3. The power drive unit according to claim 1, wherein the electronic circuit board is provided with a second guide that guides the lead pin.

4. The power drive unit according to claim 3, wherein the first guide is formed with a third hole coaxially aligned with the first hole.

5. The power drive unit according to claim 4, wherein an entrance of the third hole is tapered to facilitate insertion of the lead pin, while an exit of the third hole is made slightly larger than a diameter of the lead pin to pinch the lead pin.

* * * * *

UNITED STATES PATENT AND TRADEMARK OFFICE
CERTIFICATE OF CORRECTION

PATENT NO. : 7,835,156 B2
APPLICATION NO. : 11/220626
DATED : November 16, 2010
INVENTOR(S) : Minoru Kubokawa et al.

It is certified that error appears in the above-identified patent and that said Letters Patent is hereby corrected as shown below:

In Claim 4, Column 10, Line 58
Change

"according to claim 3"

To be

--according to claim 2--

Signed and Sealed this
First Day of March, 2011

David J. Kappos
*Director of the United States Patent and Trademark Office*